US006219810B1

(12) United States Patent
Debenham (10) Patent No.: US 6,219,810 B1
(45) Date of Patent: Apr. 17, 2001

(54) INTELLIGENT BINNING FOR ELECTRICALLY REPAIRABLE SEMICONDUCTOR CHIPS

(75) Inventor: Brett M. Debenham, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/523,579

(22) Filed: Mar. 10, 2000

Related U.S. Application Data (63) Continuation of application No. 09/049,457, filed on Mar. 27, 1998, which is a continuation of application No. 08/691,335, filed on Aug. 2, 1996, now Pat. No. 5,764,650.

(51) Int. Cl.[7] ........................................................ G06F 11/00
(52) U.S. Cl. .............................................. 714/724; 714/704
(58) Field of Search ................................... 714/724, 704, 714/48

(56) References Cited

U.S. PATENT DOCUMENTS

| | | |
|---|---|---|
| 3,721,838 | 3/1973 | Brickman et al. . |
| 4,460,997 | 7/1984 | Harns . |
| 4,460,999 | 7/1984 | Schmidt . |
| 4,584,681 | 4/1986 | Singh et al. . |
| 4,736,373 | 4/1988 | Schmidt . |
| 5,210,704 | 5/1993 | Husseiny . |
| 5,483,175 | 1/1996 | Ahmad et al. . |
| 5,502,397 | 3/1996 | Buchanan . |
| 5,764,650 | 6/1998 | Debenham . |

*Primary Examiner*—Phung M. Chung
(74) *Attorney, Agent, or Firm*—Trask Britt (57) ABSTRACT

The present invention relates to a system and method for testing one or more semiconductor devices (e.g., packaged chips). Test equipment performs at least tests of a first type on the semiconductor device and identifies failures in the semiconductor device, if any. A number of failures is determined. In the case where there are some failures, decision circuitry determines whether it is more efficient to repeat the tests or repair the semiconductor device, if it is repairable. The semiconductor device may be binned differently depending on the number of identified failures. The decision circuitry may designate the semiconductor device for an additional procedure, if the number of the identified failures is within a first number set. The decision circuitry may designate the semiconductor device for repair, if the number of the identified failures is within a second number set. The decision circuitry designate the semiconductor device for additional tests of the first type, if the number of the identified failures is within a third number set. The tests of a first type may be a hot sort procedure and the additional tests may be a cold final procedure.

41 Claims, 2 Drawing Sheets

INTELLIGENT BINNING FOR ELECTRICALLY REPAIRABLE SEMICONDUCTOR CHIPS

CROSS REFERENCE TO RELATED APPLICATIONS

This application is a continuation of application Ser. No. 09/049,457, filed Mar. 27, 1998, pending, which is a continuation of application Ser. No. 08/691,335, filed Aug. 2, 1996, now U.S. Pat. No. 5,764,650, issued Jun. 9, 1998.

BACKGROUND OF THE INVENTION

1. Field of the Invention

The invention relates to a system and method for testing semiconductor devices and, more particularly, to such a system and method in which when failures are detected, decision circuitry determines whether it is more efficient to retest or repair the semiconductor device.

2. State of the Art

Typically, finished integrated semiconductor device assemblies include a die or dice that is attached to a lead frame and encapsuled with an encapsulant. Numerous expensive and time consuming steps are involved in producing such semiconductor device assemblies. These steps may include the following: (1) forming dice on a wafer substrate, (2) testing the dice, (3) cutting dice from the wafer, (4) connecting a die or dice to a lead frame, (5) encapsulating the die or dice, lead frame, connecting wires, and any auxiliary circuitry, (6) performing burn-in and/or providing other stresses to the dice, and (7) testing the semiconductor device assembly at various stages of processing.

In semiconductor manufacturing, typically, the term "front-end" refers to the fabrication of semiconductor devices to the level of completed and tested wafers. The term "backend" refers to production stages of semiconductor devices occurring after the front-end and including such semiconductor device production stages as packaging, bumin, testing, sorting, marking, and environmental testing.

When tested, a semiconductor device may have some failure due to various causes including, but not limited to, an internal defect in the die or chip, a bad bonding connection, or a bad connection between a lead finger and a probe or other test device. Failures in a completed semiconductor device assembly can prevent it from operating as intended. In spite of painstaking attention to detail, failures may be introduced at various levels of production. For example, defects in forming the die may cause a failure. It has been found, however, that some defects are manifest immediately, while other defects are manifest only after the die has been operated for some period of time.

"Burn-in" refers to the process of accelerating failures that occur during the infant mortality phase of component life in order to remove the inherently weaker semiconductor devices. The process has been regarded as critical for product reliability since the semiconductor industry began. There have been two basic types of burn-in. During the process known as "static" burn-in, temperatures are increased (or sometimes decreased) while only some of the pins on a test semiconductor device are biased. No data is written to the semiconductor device, nor is the semiconductor device exercised under stress during static burn-in. During "unmonitored dynamic" burn-in of a semiconductor device, temperatures are increased while the pins on the semiconductor device being tested are biased.

In recent years, as semiconductor device systems have grown in complexity, the need for more and more reliable components has escalated. This need has been met in two ways. First, in semiconductor device manufacturing processes where the manufacturing process technology has reached a level of maturity and stability, inherent manufacturing defects in the semiconductor device caused by contamination and process variation have been reduced. As a result, latent failures in the semiconductor device have been significantly reduced, resulting in lower field or usage failure rates. Further, more sophisticated methods of screening infant mortality failures in semiconductor devices have been developed to help minimize such failures.

To address these issues, an "intelligent" burn-in approach of the semiconductor device can be utilized. The term "intelligent burn-in", as used in this discussion, refers to the ability to combine functional, programmable testing with the traditional burn-in cycling of the semiconductor device under test while the semiconductor device is located in the same chamber.

Some semiconductor devices have internal test modes not accessible during normal operation. These test modes may be invoked on automatic test equipment (ATE) by applying a high voltage to a single pin. The semiconductor device is then addressed in a manner so as to specify the operating mode of interest. Operating modes, such as data compression, grounded substrate, and cell plate biasing can be enabled, thus allowing evaluation of operating characteristics of the semiconductor device and help in isolating possible failure mechanisms.

The electrical characterization data gathered from such tests is then used to identify the part of the circuit of the semiconductor device that appears to be malfunctioning, the possible location(s) of such malfunctions on the semiconductor device, and the most probable type or nature of the defect of the semiconductor device. To facilitate discussion and reporting, semiconductor device failures are often classified according to their electrical characteristics, commonly referred to as the failure mode. Typical classification of these modes include the following: single cell defect, adjacent cell defect, row failure, column failure, address failure, open pin, supply leakage, pin leakage, standby current leakage, and entire array failure (all dead cells).

In anticipation that some semiconductor devices will have defects, many semiconductor devices are designed with redundancies. In such semiconductor devices, a defective section of the semiconductor devices may be shut off and a redundant but properly operating section activated and used in place of the defective section. For example, typical integrated memory circuits include arrays of memory cells arranged in rows and columns. In many such integrated memory arrays, several redundant rows and columns are provided to be used as substitutes for defective rows or columns of memory. When a defective row or column is identified in the array, rather than treating the entire array as defective, a redundant row or column is substituted for the defective row or column. This substitution is performed by assigning the address of the defective row or column in the array to the redundant row or column such that, when an address signal corresponding to the defective row or column is received, the redundant row or column is addressed instead.

To make the substitution of the redundant row or column in the array, substantially transparent to an operating system employing the memory circuit, the memory circuit may include an address detection circuit. The address detection circuit monitors the row and column addresses and, when the address of a defective row or column is received, enables or substitutes the redundant row or column in the array for the defective row or column.

One type of address detection circuit for memory type semiconductor devices is a fuse-bank address detection circuit. Fuse-bank address detection circuits employ a bank of sense lines where each sense line corresponds to a bit of an address in the array of memory circuits. The sense lines are programmed by blowing fuses in the sense lines in a pattern corresponding to the address of the defective row or column in the array of memory circuits. Addresses are then detected by first applying a test voltage across the bank of sense lines. Then, bits of the address are applied to the sense lines. If the pattern of blown fuses precisely corresponds to the pattern of address bits, the sense lines all block current and the voltage across the bank remains high. Otherwise, at least one sense line is conductive and the voltage falls. Thus, a high voltage indicates the programmed address has been detected while a low voltage indicates a different address has been applied.

Antifuses have been used in place of conventional fuses. Antifuses are capacitive-type structures that, in their unblown states, form open circuits. Antifuses may be "blown" by applying a high voltage across the antifuse. The high voltage causes the capacitive-type structure to break down, thereby forming a conductive path through the antifuse.

Failures detected during a test of a semiconductor device may be caused by an actual failure in the semiconductor device or through a failure in the test system or through an environmental cause. If there is an actual failure of the semiconductor device, it is typically most efficient to repair the tested semiconductor device, if possible, rather than retest the semiconductor device (which may be very time consuming). On the other hand, if the failure is due to the test system or an environmental cause, the identification of failures will not be accurate and repair will not be an efficient use of resources.

Accordingly, there is a need for a system and method that determines whether it is more efficient to repair or retest a semiconductor device when failures are detected in testing.

SUMMARY OF THE INVENTION

The present invention relates to a system and method for testing a semiconductor device. The semiconductor device may be any of a variety of devices, including, but not limited to, a chip on a wafer, a bare chip off a wafer, a packaged chip including a package and leads. The chip may perform any of a variety of functions including, but not limited to, memory, microprocessor, and ASIC functions. Further, the system and method may involve testing more than one semiconductor device at a time.

A handler or prober may include a support that supports the semiconductor device and a regulated chamber. The support may be stationary or mobile. It may slide or rotate in and out of one or more regulated chambers (that regulate heat and perhaps also moisture). The support may support only one or more than one semiconductor device to be tested.

Test equipment, such as automated test equipment, performs tests on the semiconductor device. Under one embodiment, the test equipment includes probes that contact, for example, pads on the semiconductor device. In another embodiment, the support includes sockets that receive leads of the semiconductor device, and the test equipment makes electrical contact with the sockets to allow testing. The invention is not limited to sockets or probes, but may include any of various other means of making electrical contact. A testing controller may control the test equipment and regulated chamber.

Repair functions may be performed by the test equipment, adjacent repair equipment, or a remote test station.

A system controller may control the testing controller and the repair functions.

The test equipment may perform tests of a first type on the semiconductor device to identify failures in the semiconductor device, if any. A determination of the number of identified failures may be made by processing circuitry, which may be included in the system controller, testing controller, test equipment, or elsewhere. Decision circuitry may designate the semiconductor device as being ready for an additional procedure if, for example, the number of the identified failures is within a first number set. The decision circuitry may designate the semiconductor device for repair if, for example, the number of the identified failures is within a second number set. The decision circuitry may designate the semiconductor device for additional tests of the first type if, for example, the number of the identified failures is within a third number set. In an alternative embodiment, there could be another number set that divides one of the other number sets or a combination of them. Merely as examples, the tests of a first type may be a hot sort procedure and the additional tests may be a cold final procedure. The invention may be implemented with other procedures.

The decision circuitry may be included in the system controller, the testing controller, the test equipment, or a combination of them, or elsewhere. The decision circuitry may use a fail bit counter in, for example, a backend test flow. Based on the number of bits in the semiconductor device that failed during the flow, the probability of repairing the part can be calculated. The semiconductor device may be binned differently, depending on the number of identified failures.

The decision circuitry may identify failures in the semiconductor device and determine a total number of identified failures, if any, in which the failures may be classified by class and a number of identified failures for each class is determined, and wherein the total number of identified failures equals a sum of the identified failures for each class. In such a case, the decision circuitry may designate the semiconductor device as being ready for an additional procedure, designate the semiconductor device for repair, or designate the semiconductor device for additional tests of the first type, depending on a combination of the total number of identified failures and the number of identified failures in at least one of the classes.

The decision circuitry may detect certain defects in the semiconductor device which are not classified as examples of the failures and, therefore, do not contribute to the number of identified failures.

In the case in which the decision circuitry designates the semiconductor device for repair, the decision circuitry may determine whether the semiconductor device is repairable and, if it is, a repair station may repair the semiconductor device.

Under one embodiment of the invention, the semiconductor device is rejected, junked or discarded if the number of the identified failures is within the second number set, but it is determined that the semiconductor device is not repairable.

The number sets are not restricted to any particular values but may include, for example, a signal number, a series of integers, or a range of numbers. There may be gaps between the number sets. In one embodiment, the first number set includes only zero, the second number set includes numbers greater than zero and less than a threshold, and the third number set includes numbers equal to or greater than the threshold. Although in a preferred embodiment, each failure causes the number of failures to increment by one, the system or method could work by incrementing with values less than one or in negative numbers, or by decrementing. Different classes of failures could cause different values of incrementing or decrementing.

The tests of the first type may include subjecting the semiconductor device to various temperatures in a first range while monitoring electrical signals on the semiconductor device and in which the additional procedure includes subjecting the semiconductor device to various temperatures in a second range while monitoring electrical signals on the semiconductor device. There may be an overlap between the first and second ranges, or there may be no overlap between the ranges.

The tests of the first type and the additional tests of the first type may differ in some detail, although both may be of the first type, or may be identical.

In the additional tests of the first type, failures in the semiconductor device may be re-identified and a number of re-identified failures may be determined, and subsequently, the decision circuitry may designate the semiconductor device as being ready for the additional procedure if, for example, the number of the re-identified failures is within a fourth number set, the decision circuitry may designate the semiconductor device for repair if, for example, the number of the re-identified failures is within a fifth number set, and the decision circuitry may designate the semiconductor device for additional tests of the first type on the semiconductor device if, for example, the number of the re-identified failures is within a sixth number set. The decision circuitry may repeat these functions until the number of the re-identified failures is within the fourth number set, the semiconductor device is repairable and the number of the re-identified failures is within the fifth number set, or the additional tests of the first type have been performed a predetermined number of times and the number of re-identified failures is within the sixth number set (in which case the semiconductor device may be repaired, junked, or discarded). The fourth, fifth, and sixth number sets may be identical to or differ from the first, second, and third number sets, respectively. The values of the fifth and sixth number sets may change or remain constant as the functions are repeated.

In the additional procedure, the decision circuitry may designate the semiconductor device for tests of a second type to re-identify failures in the semiconductor device and determine a number of re-identified failures, if any. In such a case, the decision circuitry may designate the semiconductor device as being ready for a further procedure if, for example, the number of the re-identified failures is within a seventh number set; the decision circuitry may designate the semiconductor device for repair if, for example, the number of the re-identified failures is within an eighth number set; and the decision circuitry may designate the semiconductor device for additional tests of the second type if, for example, the number of the identified failures is within a ninth number set. The seventh, eighth, and ninth number sets may be identical to the first, second, and third number sets, respectively, or some other values.

The decision circuitry may designate the semiconductor device for repair if the number of the total identified failures is within a second number set, and the number of identified failures in a particular class is not within an auxiliary number set; and the decision circuitry may designate the semiconductor device for additional tests of the first type if either the total number of the identified failures is within a third number set or the number of identified failures in a particular class is within the auxiliary number set.

The decision circuitry may include dedicated hardware without software, circuitry that runs software (or firmware), such as a microprocessor, or some combination of them, or some other circuitry that may make decisions based on inputs.

The system may include wireless transmission of information.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
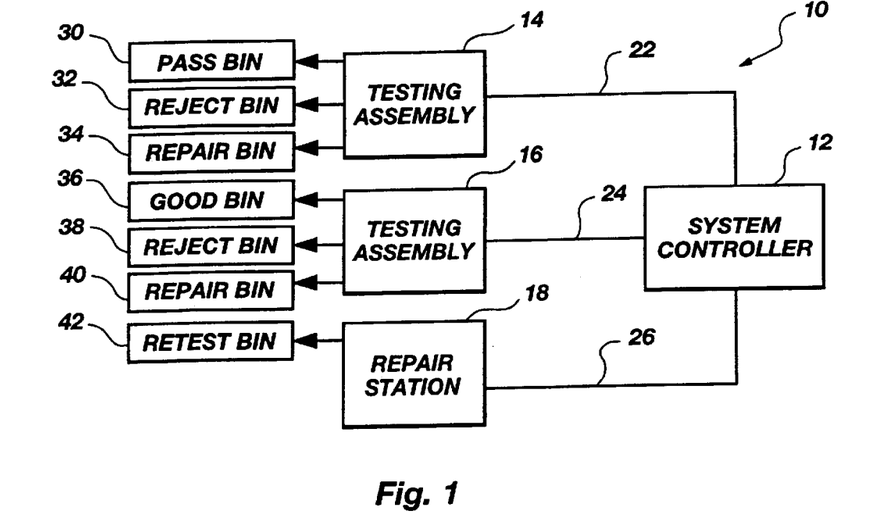
FIG. 1 shows a schematic representation of a testing system including a system controller, a testing assembly, and a repair station.

Referring to FIG. 1, testing system 10 includes a system controller 12, a first testing assembly 14 (which may be a hot sort testing assembly), a second testing assembly 16 (which may be a cold final testing assembly), and a repair station 18. Testing assembly 16 may be identical to, or differ somewhat from, testing assembly 14. Information regarding tests to be performed and results of tests may be communicated between testing assembly 14 and system controller 12 through conductor(s) 22. Information regarding tests to be performed and results of tests may be communicated between testing assembly 16 and system controller 12 through conductor(s) 24. Information regarding repairs to be performed and perhaps results of tests may be communicated between system controller 12 and repair station 18 through conductor(s) 26.

As described in greater detail below, certain bins may be used in connection with testing assemblies 14 and 16. Following a completion of testing in testing assembly 14, semiconductor devices may be relocated to a pass bin 30, a reject bin 32, or a repair bin 34. The relocation may occur through any of various well known means, including manual and through gravity fed tubes. Of course, bins are not required and various other bins or techniques could be used. Following a completion of testing in testing assembly 16, the semiconductor devices may be relocated to a good bin 36, a reject bin 38, or a repair bin 40. Again, bins are not required and various other bins or techniques could be used. Following completion of repair in repair station 18, the semiconductor devices may be relocated into a retest bin 42. Again, bins are not required and various other bins (such as a reject bin) or techniques could be used.

Figure 2:
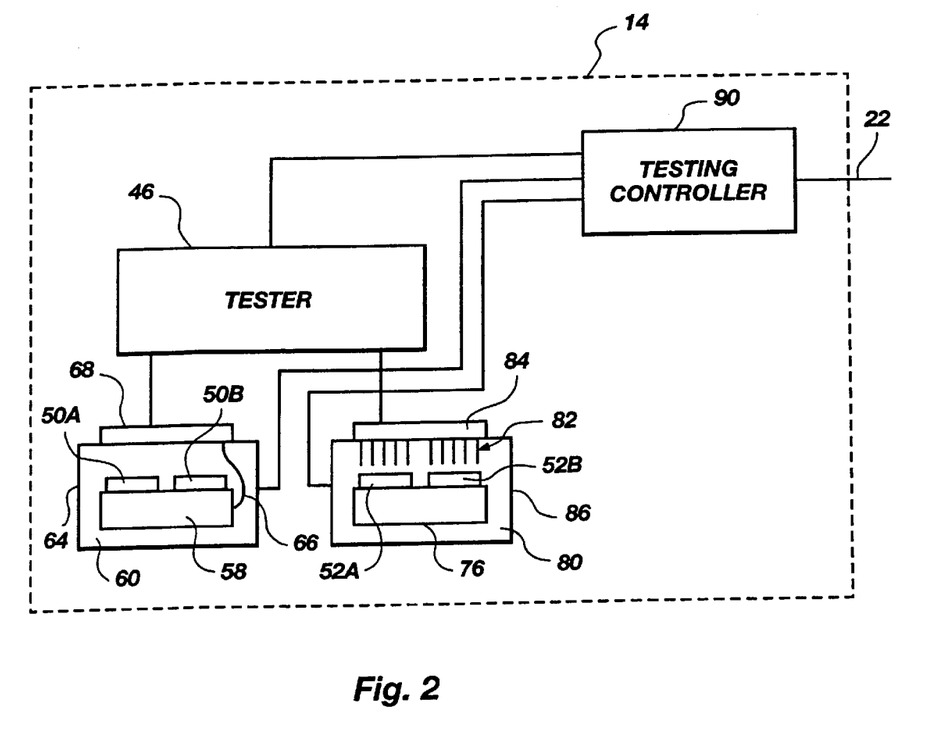
FIG. 2 shows a schematic side view representation of one embodiment of the testing assembly of FIG. 1.

Those skilled in the art will appreciate that a variety of electrical and mechanical equipment may be used in testing assembly 14. FIG. 2 illustrates one embodiment of testing assembly 14. FIG. 2 is in schematic form, not necessarily to scale, and omits various details well known to those skilled in the art.

Referring to FIG. 2, testing assembly 14 includes a tester 46 that performs tests on semiconductor devices. The semiconductor devices each may be any of a variety of devices including, but not limited to, a wafer, chips on a wafer, bare chips off a wafer, or packaged chips including a package and leads. Merely as an example, semiconductor devices 50A and 50B (collectively semiconductor devices 50) are each packaged chips including leads, and semiconductor devices 52A and 52B (collectively semiconductor devices 52) are each wafers having numerous chips (or dice). The equipment of testing assembly 14 is preferably automated test equipment.

Semiconductor devices 50 are supported by support 58 in regulated chamber 60 that is included in a handler 64. Support 58 includes sockets that receive lead fingers of semiconductor devices 50 and provide electrical contact between the lead fingers and conductors 66. Conductors 66 are connected to an interface board 68, which in turn is connected to tester 46. Interface board 68 may be inside or outside regulated chamber 60. Regulated chamber 60 provides heat and perhaps also humidity regulation to semiconductor devices 50. Although two semiconductor devices are shown in handler 64, the number may be only one or more than two.

Semiconductor devices 52 are supported by a support 76 in a regulated chamber 80, which provides heat and perhaps also humidity regulation to semiconductor devices 52. Probes 82, which are connected to probe card 84, make electrical contact with semiconductor devices 52. Support 76, regulated chamber 80, and probes 82 are included in a prober 86. Probe card 84 may be inside or outside regulated chamber 80. Although two semiconductor devices are shown in prober 86, the number may be only one or more than two.

Tester 46 may test semiconductor devices in connection with more than one handler and no prober; more than one prober and no handler; or at least one handler and at least one prober.

Tester 46 performs tests to identify failures in semiconductor devices 50 and 52 (e.g., the location of bad memory cells). The number of identified failures is calculated in processing circuitry, which may be included in tester 46, testing controller 90, system controller 12, or elsewhere. A signal indicative of the number of failures is produced by the processing circuitry. Tester 46 communicates with testing controller 90, which in turn communicates with system controller 12. Testing controller 90 provides control signals to regulated chambers 60 and 80 and tester 46. The functions of testing controller 90 may be performed by other circuitry, such that testing controller 90 is not necessary.

In a preferred embodiment, system controller 12 analyzes the signal indicative of the number of failures and determines, based on the number of failures, whether to designate a semiconductor device for an additional procedure, designate the semiconductor device for repair, or designate the semiconductor device for additional tests of the type previously received. Examples of the basis for such a determination are described below in connection with FIG. 3. The act of designation may be made by, for example, writing data in a particular location in the memory of system controller 12. Alternatively, the act of designation may be made by physically moving a semiconductor device to a different location or bin, or marking the semiconductor device.

Repair operations may be any standard repair including fuse and/or antifuse operations. Repair operations may be controlled through a repair controller in repair station 18, or through testing assembly 14 or 16 (making repair station 18 unnecessary). The functions of testing assembly 16 may be performed in testing assembly 14, making testing assembly 16 unnecessary. Further, there may be more than two testing assemblies connected to system controller 12. The functions of system controller 12 may be performed in testing assembly 14 by, for example, tester 46 or testing controller 90.

Figure 3:
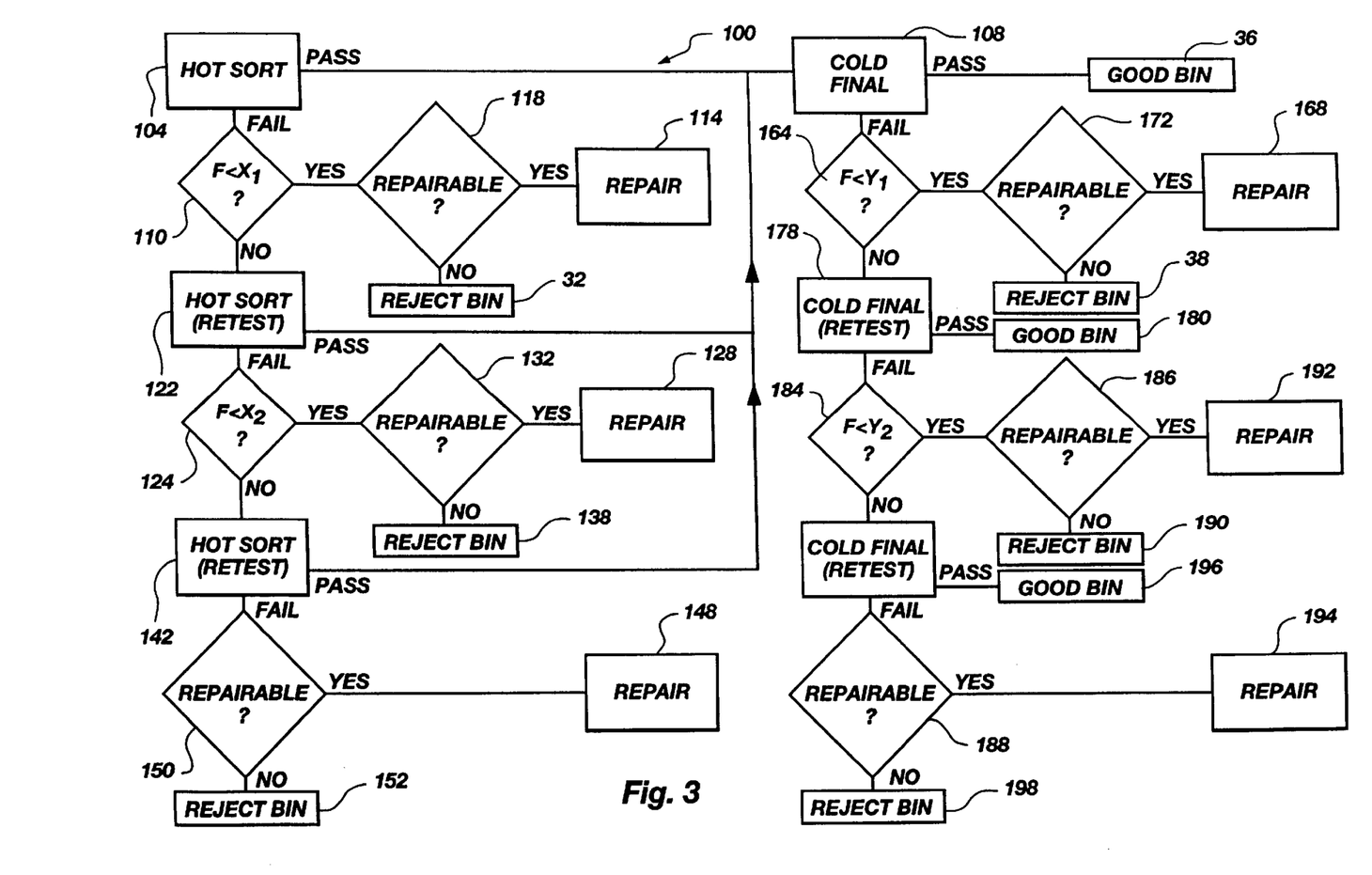
FIG. 3 is a flow diagram illustrating one possible testing scheme under the present invention.

FIG. 3 is a flow diagram 100 that illustrates one possible testing scheme under the present invention. It will, however, be apparent that other tests may be used within the scope of the invention.

Referring to FIG. 3, box 104 represents a hot sort test, which is an example of a test of a first type. During an exemplary hot sort test, a semiconductor device is subjected to changing temperatures in a hot range while signals are applied to and read or monitored from the semiconductor device. The test may involve determining a number of failures (F), for example, failed bits, in a semiconductor device. At the conclusion of the test, decision circuitry (such as in system controller 12) directs the process as follows. If the number of failures F is within a first number set, the semiconductor device is considered to have passed the hot sort test. In a preferred embodiment of the invention, the first number set contains only the number zero. Under this embodiment, if there are no failed bits F, the semiconductor device passes the hot sort test. Otherwise, the semiconductor device fails the hot sort test. If the semiconductor device passes the hot sort test, then the semiconductor device is subjected to another procedure, which in a preferred embodiment is a cold final test 108. If the same testing assembly performs both hot sort and cold final tests, there may be no need for a pass bin. However, if different test assemblies perform the hot sort and cold final tests (as illustrated in FIG. 1), there may be a pass bin 30 as shown in FIG. 1.

If the semiconductor device fails the hot sort test, then it is determined in decision box 110 whether the number of failures is within a second number set or a third number set. In a preferred embodiment, the second number set includes numbers greater than zero, but less than a threshold $X_1$. The third number set includes numbers greater than or equal to the threshold $X_1$. (The second number set could include the threshold $X_1$, and the third number set could be restricted to being greater than $X_1$.) In an alternative embodiment, there could be another number set that divides the second number set or the third number set, or a combination of both.

A purpose of determining whether the number of failures is within the second or third number set is as follows. It has been discovered that where there are a small number of failures, the failures tend to be actual failures in the device rather than environmental failures, such as bad contacts between the probes and the semiconductor device. If there are actual failures, it is more efficient to repair the failures in the device, rather than retest the device. Alternatively, if there are environmental failures, such as bad contacts, it is more efficient to retest the semiconductor device to determine whether there are actual failures, before repairing the device.

Referring to FIG. 3, if $F<X_1$, (i.e., F is within the second number set), the semiconductor device is designated for repair. As noted, the repair may take place at the same location as the test, or at a different location. Prior to the repair step, illustrated by box 114, it may be determined whether the semiconductor device is repairable, as illustrated in decision box 118. If it is not repairable, the semiconductor device is placed in reject bin 32 or otherwise designated for rejection. As such, the semiconductor device would be rejected, junked, or discarded. However, it is noted that rejected semiconductor devices may have some usefulness. For example, portions of them may work properly.

If it is repairable, the semiconductor device is repaired. Once repaired, the semiconductor device may be retested as in hot sort box 104 or placed in a good bin.

If F is not less than $X_1$, (ie. F is within the third number set), then the semiconductor device may be retested, such as in another hot sort, as is illustrated in box 122. Again, it is determined whether the semiconductor device passed the test, which requires that the number of failures be in a fourth number set. In a preferred embodiment, the fourth number set is identical to the first number set (i.e., zero failures). If it passes, the semiconductor device is subject to an additional procedure such as the cold final test of box 108.

An optimal value of $X_1$, depends on various conditions including the type of semiconductor device being tested. However, a value of $X_1=6$ has been found to be useful for some memory devices. The invention may have particular value at a later stage of production (such as the backend) when a larger number of errors have already been dealt with. However, the testing of the invention may occur in the front end. A method of determining the threshold may include performing tests on numerous semiconductor devices and creating a record of the number of failures, and retesting the semiconductor devices and creating a record of the number of failures determined in the retest. The number of failures determined in the test may be compared with the number of failures determined in the retest to determine a threshold at which retesting is not economical.

As illustrated in box 124, if the semiconductor device fails the test of box 122, it is determined whether the number of failures F is less than a threshold $X_2$ and, therefore, within a fifth number set. In a preferred embodiment, $X_2=X_1$ and the fifth number set equals the second number set. If $F<X_2$, the semiconductor device is designated for repair. Prior to the repair step, illustrated by box 128, it may be determined whether the semiconductor device is repairable, as illustrated in decision box 132. If it is not repairable, the semiconductor device is placed in a reject bin 138 (which may be reject bin 32) or otherwise designated for rejection.

If F is not less than $X_2$ (i.e., F is within a sixth number set), then the semiconductor device may be retested, such as in another hot sort, as is illustrated in box 142. Again, it is determined whether the semiconductor device passed the test, which requires that the number of failures be within a certain number set (which may be identical to the first number set). If the semiconductor device does not pass, there may be a decision such as in boxes 110 and 124, or the semiconductor device may be designated for repair. In other words, the retesting can continue more times than is illustrated in FIG. 3. Prior to the repair step, illustrated by box 148, it may be determined whether the semiconductor device is repairable, as illustrated in decision box 150. If it is not repairable, the semiconductor device is placed in a reject bin 152 (which may be reject bin 32) or otherwise designated for rejection.

The cold final procedure, which is an example of a test of a second type, may be similar to the hot sort procedure, but at lower temperatures. If the semiconductor device passes the cold final test of box 108, it may be passed to a good bin 36 (or pass bin 30) or otherwise designated as being ready for an additional procedure. To pass, the number of failures during the cold final test is within a seventh number set. In a preferred embodiment, the seventh number set contains only the number zero. If the number of failures is within the seventh number set, the system controller may designate the semiconductor device as being ready for a further procedure. The further procedure could be any of a variety of things, such as cutting the semiconductor device from a wafer (assuming it is on a wafer) or marking the semiconductor device with letters indicating the manufacturer and chip number (assuming the semiconductor device is packaged), to name only two.

If the semiconductor device fails the cold final test, it is determined whether the number of failures is within an eighth number set or a ninth number set in decision box 164. In a preferred embodiment, the eighth number set includes numbers greater than zero, but less than a threshold $Y_1$. ($Y_1$ may equal $X_1$.) The ninth number set includes numbers greater than or equal to the threshold $Y_1$. (The eighth number set could have included the threshold $Y_1$, and the ninth number set could have been restricted to being greater than $Y_1$.) In an alternative embodiment, there could have been another number set that divides the eighth number set or the ninth number set, or a combination of both.

If the number of failures is within the eighth number set, the semiconductor device is designated for repair as illustrated in box 168. It may be determined whether the semiconductor device is repairable, as illustrated in decision box 172, prior to attempting the repair. If it is not repairable, then the semiconductor device may be placed in reject bin 38 (or reject bin 32) or otherwise designated as rejected. If repaired, the semiconductor device may be retested or designated for another procedure.

If the number of failures is within the ninth number set, the tests of the second type may be repeated as illustrated in box 178. If the retest is passed, the semiconductor device may be placed in a good bin 180 (which may be good bin 36). If the retest is failed, the determination is made whether the number of failures F during retest is less than a threshold $Y_2$ in decision box 184. $Y_2$ may equal $Y_1$. The operations of decision boxes 186 and 188 may be the same as in decision box 172, however, the number of times the retest is repeated may be more than is illustrated in FIG. 3. The operations of repair boxes 192 and 194 may be the same as in repair box 168. Good bin 196 may be good bin 36 or 180 or pass bin 30; and reject bin 198 may be reject bin 32, 38, or 190.

The failures may be classified by class and a number of identified failures for each class be determined. The total number of identified failures may equal a sum of the identified failures for each class. In such a case, system controller 12 may designate the semiconductor device as being ready for an additional procedure, designate the semiconductor device for repair, or perform additional tests of the first type on the semiconductor device, depending on a combination of the total number of identified failures and the number of identified failures in at least one of the classes.

As presently contemplated, semiconductor devices are manually carried between testing assembly 14 and repair station 18. However, the transportation could be automated.

The division of decision making between system controller 12, tester 46, and testing controller 90 is somewhat arbitrary. For example, the decision at box 110 could be made by system controller 12, tester 46, or testing controller 90.

As used herein, the terms "connect," "connectable," or "connected" are not necessarily limited to a direct connection.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A system for testing at least one semiconductor device of a plurality of semiconductor devices, the system comprising:

test equipment for performing at least one test of a first type on the at least one semiconductor device to identify at least one failure in the at least one semiconductor device, processing circuitry for communicating with the test equipment and for determining at least one failure of a number of failures and for providing signals indicative thereof, decision circuitry for receiving the signals indicative of the number of failures, and for considering the number of failures, to designate the at least one semiconductor device for an additional procedure, designate the at least one semiconductor device for repair, or designate the at least one semiconductor device for additional tests of the first type, said decision circuitry designating the at least one semiconductor device for the additional procedure if the number of the identified failures is within a first number set; and designating the at least one semiconductor device for repair if the number of the identified failures is within a second number set.

2. The system of claim 1, wherein the at least one semiconductor device is a first semiconductor device and a support supports other semiconductor devices tested by the test equipment.

3. The system of claim 1, wherein the decision circuitry designates the at least one semiconductor device for the additional tests of the first type if the number of the identified failures is within a third number set.

4. The system of claim 3, wherein the first number set includes only zero, the second number set includes numbers greater than zero and less than a threshold, and the third number set includes numbers equal to or greater than the threshold.

5. The system of claim 3, wherein the at least one semiconductor device is rejected if the number of the identified failures is within the second number set and the at least one semiconductor device is not repairable.

6. The system of claim 3, wherein the additional tests of the first type are performed, failures in the at least one semiconductor device are re-identified and a number of re-identified failures are determined, with the decision circuitry subsequently:

designating the at least one semiconductor device for the additional procedure when the number of the re-identified failures is within a fourth number set;

designating the at least one semiconductor device for repair when the number of the re-identified failures is within a fifth number set;

designating the at least one semiconductor device for additional tests of the first type when the number of the re-identified failures is within a sixth number set; and wherein the decision circuitry repeats such designations until alternately the number of the re-identified failures is within the fourth number set, the at least one semiconductor device is repairable and the number of the re-identified failures is within the fifth number set, or the additional tests of the first type have been performed a predetermined number of times and the number of re-identified failures is within the sixth number set.

7. The system of claim 6, wherein the values of the fifth and sixth number sets change.

8. The system of claim 1, wherein the processing circuitry is located proximate to the test equipment.

9. The system of claim 1, wherein the processing circuitry is located remote from test equipment.

10. The system of claim 1, further comprising:

a pass bin into which the at least one semiconductor device is relocated if the at least one semiconductor device is designated for the additional procedure; and a repair bin into which the at least one semiconductor device is relocated if the at least one semiconductor device is designated for repair.

11. The system of claim 10, further comprising: a reject bin into which the at least one semiconductor device is relocated if it is determined to be non-repairable.

12. The system of claim 1 further comprising:

a system controller; and a repair station, wherein the system controller includes the decision circuitry and controls the repair station.

13. The system of claim 1, further comprising:

a repair station, and wherein subsequent to the decision circuitry designating the at least one semiconductor device for repair, the decision circuitry determines whether the at least one semiconductor device is repairable and, if the at least one semiconductor device is repairable, the repair station repairs the at least one semiconductor device.

14. The system of claim 1, wherein the test equipment includes repair circuitry that performs the repair on the at least one semiconductor device if it is designated for repair and is repairable.

15. The system of claim 1, wherein the at least one semiconductor device is binned based upon the number of identified failures.

16. The system of claim 1, wherein the identified failures include failures of different classes, and in which the number of identified failures is a number of total failures of all classes, and the decision circuitry considers failures of different classes in determining whether to designate the at least one semiconductor device for the additional procedure, designate the at least one semiconductor device for repair, or perform additional tests of the first type.

17. The system of claim 1, wherein the tests of the first type may detect certain defects in the at least one semiconductor device which are not classified as examples of the failures and, therefore, do not contribute to the number of the identified failures.

18. The system of claim 1, wherein the additional procedure includes transporting the at least one semiconductor device to a predetermined location.

19. The system of claim 1, further comprising: a temperature regulated chamber in which the tests of the first type are performed.

20. The system of claim 1, further comprising:

a first temperature regulated chamber in which the tests of the first type are performed; and a second temperature regulated chamber in which the additional procedure is performed.

21. The system of claim 1, wherein the test equipment includes probes, and electrical connection is made between the probes and the at least one semiconductor device.

22. The system of claim 2, wherein the at least one semiconductor device includes leads and the support includes sockets for receiving the leads, and electrical connection is made between the test equipment and the sockets.

23. The system of claim 1, wherein the tests of the first type include:
  subjecting the at least one semiconductor device to various temperatures in a first range while monitoring electrical signals on the at least one semiconductor device; and
  the additional procedure includes subjecting the at least one semiconductor device to various temperatures in a second range while monitoring electrical signals on the at least one semiconductor device.

24. The system of claim 23, wherein no substantial overlap occurs between the first and second ranges.

25. The system of claim 1, wherein the at least one semiconductor device is a chip on a wafer.

26. The system of claim 1, wherein the at least one semiconductor device is a packaged chip including a package and leads.

27. The system of claim 1, wherein tests of the first type and the additional tests of the first type are both of the first type, but not identical.

28. The system of claim 27, wherein the additional procedure performed by the decision circuitry includes:
  designating the at least one semiconductor device for tests of a second type to re-identify failures in the at least one semiconductor device and determine a number of re-identified failures;
  designating the at least one semiconductor device for a further procedure when the number of the re-identified failures is within a seventh number set;
  designating the at least one semiconductor device for repair when the number of the re-identified failures is within an eighth number set; and
  the test equipment performing additional tests of the second type on the at least one semiconductor device when the number of the identified failures is within a ninth number set.

29. The system of claim 28, wherein the tests of the first type are performed in a first temperature regulated chamber and wherein the tests of the second type are performed in the first temperature regulated chamber.

30. The system of claim 1, wherein the decision circuitry includes:
  a testing controller to control the tests of the first type; and
  a data analyzer receiving data from the tests of the first type and determining, alternately, to designate the at least one semiconductor device for the additional procedure, to designate the at least one semiconductor device for repair, or to perform additional tests of the first type on the at least one semiconductor device.

31. The system of claim 30, wherein the testing controller and the data analyzer are remotely located from each other.

32. A system for testing at least one semiconductor device of a plurality of semiconductor devices, the system comprising:
  test apparatus for performing tests of a first type on the at least one semiconductor device, for identifying failures in the at least one semiconductor device, and determining at least one failure of the number of identified failures, wherein the test apparatus alternately:
    designates the at least one semiconductor device for an additional procedure when the number of the identified failures is within a first number set;
    designates the at least one semiconductor device for repair when the number of the identified failures is within a second number set; and
    designates the at least one semiconductor device for additional tests of the first type when the number of the identified failures is within a third number set.

33. A system for testing at least one semiconductor device of a plurality of semiconductor devices, the system comprising:
  test equipment performing at least one test of a plurality of tests of a first type on the at least one semiconductor device to identify at least one failure of a plurality of failures in the at least one semiconductor device;
  processing circuitry communicating with the test equipment, determining at least one failure of a number of failures, and providing signals indicative thereof, and
  decision circuitry receiving the signals indicative of at least one failure of the number of failures, the decision circuitry determining the number of failures, and thereafter, the decision circuitry designating the at least one semiconductor device for an additional procedure, designating the at least one semiconductor device for repair, or designates the at least one semiconductor device for additional tests of the first type, the decision circuitry classifying failures by class and numbers of the identified failures, a total number of identified failures equaling a sum of the identified failures for each class, and the decision circuitry considering the total number of identified failures and the number of identified failures in at least one of the classes of a plurality of failures.

34. A system for testing at least one semiconductor device of a plurality of semiconductor devices, the system comprising:
  test equipment electrically connected to the at least one semiconductor device, the test equipment performing tests of a first type on the at least one semiconductor device identifying at least one failure of a plurality of failures in the at least one semiconductor device;
  processing circuitry communicating with the test equipment determining a total number of identified failures and classifying the identified failures by a class and a number for each class determined, the total number of identified failures equaling a sum of the identified failures for each class; and
  decision circuitry designating the at least one semiconductor device for an additional procedure when the total number of the identified failures is within a first number set, the decision circuitry designating the at least one semiconductor device for repair when the total number of identified failures is within a second number set and the number of identified failures in a predetermined class is not within an auxiliary number set, and the decision circuitry performing additional tests of the first type on the at least one semiconductor device when either the total number of the identified failures is within a third number set or the number of identified failures in the predetermined class is within the auxiliary number set.

35. A method for testing at least one semiconductor device of a plurality of semiconductor devices, comprising:
  performing tests of a first type on at least one semiconductor device to identify failures in the at least one semiconductor device;
  determining the number of identified failures;

designating the at least one semiconductor device having at least one identified failure for an additional procedure when the number of the identified failures is within a first number set;

determining if the number of identified failures is within a second number set;

repairing the at least one semiconductor device when the number of the identified failures is within the second number set; and performing other tests of the first type on the at least one semiconductor device when the number of the identified failures is within a third number set.

36. The method of claim 35, further comprising the step of: determining when the at least one semiconductor device is repairable.

37. The method of claim 35, wherein the additional tests of the first type are performed, failures in the at least one semiconductor device are re-identified and the number of re-identified failures is determined, further comprising the steps of:

designating the at least one semiconductor device being ready for the additional procedure when the number of the re-identified failures is within a fourth number set;

repairing the at least one semiconductor device when the number of the re-identified failures is within a fifth number set;

performing the additional tests of the first type on the at least one semiconductor device when the number of the re-identified failures is within a sixth number set; and wherein the steps of designating, repairing, and performing set forth above are repeated until, alternately, the number of the re-identified failures is within the fourth number set, the at least one semiconductor device is repairable and the number of the re-identified failures is within the fifth number set, or the additional tests of the first type have been performed a predetermined number of times and the number of re-identified failures is within the sixth number set.

38. The method of claim 37, wherein the tests of the first type and the additional tests of the first type are each substantially performed in a first temperature regulated chamber.

39. The method of claim 37, wherein the additional procedure includes the steps of:

performing tests of a second type on the at least one semiconductor device re-identifying failures in the at least one semiconductor device and determining a number of re-identified failures;

designating the at least one semiconductor device for a further procedure when the number of the re-identified failures is within a seventh number set;

repairing the at least one semiconductor device when the number of the re-identified failures is within an eighth number set; and performing additional tests of the second type on the at least one semiconductor device when the number of the identified failures is within a ninth number set.

40. The method of claim 39, wherein the seventh, eighth, and ninth number sets are substantially identical to the first, second, and third number sets, respectively.

41. The method of claim 39, wherein the tests of a first type include a hot sort procedure and wherein the tests of a second type include a cold final procedure.

* * * * *

UNITED STATES PATENT AND TRADEMARK OFFICE
CERTIFICATE OF CORRECTION

PATENT NO.    : 6,219,810 B1
DATED         : April 17, 2001
INVENTOR(S)   : Brett M. Debenham It is certified that error appears in the above-identified patent and that said Letters Patent is hereby corrected as shown below:

<u>Title page,</u>
Item [63], Related U.S. Application Data, after "1998," insert -- now U.S. Patent No. 6,138,256, issued October 24, 2000, --

<u>Column 1,</u>
Line 9, after "1998", delete "pending" and add -- now U.S. Patent No. 6,138,256, issued October 24, 2000 --
Line 41, change "bumin" to -- burn-in --

Signed and Sealed this

Thirteenth Day of May, 2003

JAMES E. ROGAN
*Director of the United States Patent and Trademark Office*